US008996759B2

(12) United States Patent
Chung

(10) Patent No.: US 8,996,759 B2
(45) Date of Patent: Mar. 31, 2015

(54) MULTI-CHIP MEMORY DEVICES AND METHODS OF CONTROLLING THE SAME

(75) Inventor: Hoiju Chung, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 539 days.

(21) Appl. No.: 13/295,793

(22) Filed: Nov. 14, 2011

(65) Prior Publication Data

US 2012/0140583 A1 Jun. 7, 2012

(30) Foreign Application Priority Data

Dec. 3, 2010 (KR) ........................ 10-2010-0122920

(51) Int. Cl.
*G11C 7/10* (2006.01)
(52) U.S. Cl.
CPC ........ *G11C 7/109* (2013.01); *G06F 2213/0038* (2013.01)
USPC ............ 710/39; 711/160; 711/158; 711/151; 711/156; 710/44; 710/40; 710/46

(58) Field of Classification Search
USPC ............ 711/167, 160, 158, 156, 151; 710/48, 710/47, 46, 44, 40, 39
See application file for complete search history.

(56) References Cited

U.S. PATENT DOCUMENTS 4,280,065 A * 7/1981 Minato et al. ................... 326/58
5,974,499 A * 10/1999 Norman et al. ............... 711/103
6,094,693 A * 7/2000 Haneda ........................... 710/36

FOREIGN PATENT DOCUMENTS

| JP | 2002-133884 A | 5/2002 |
| KR | 10-2002-0044907 A | 6/2002 |
| KR | 10-0861185 B1 | 9/2008 |
| KR | 10-0875009 B1 | 12/2008 |

* cited by examiner

*Primary Examiner* — J. H. Hur
(74) *Attorney, Agent, or Firm* — Sughrue Mion, PLLC

(57) ABSTRACT

A multi-chip memory device and a method of controlling the same are provided. The multi-chip memory device includes a first memory chip; and a second memory chip sharing an input/output signal line with the first memory chip, wherein each of the first memory chip and the second memory chip determines whether to execute a command unaccompanied by an address, by referring to a history of commands.

16 Claims, 16 Drawing Sheets

MULTI-CHIP MEMORY DEVICES AND METHODS OF CONTROLLING THE SAME

CROSS-REFERENCE TO RELATED APPLICATIONS

This application claims priority from Korean Patent Application No. 10-2010-0122920, filed Dec. 3, 2010, the entire contents of which are hereby incorporated by reference.

BACKGROUND

1. Field

The present disclosure relates to a semiconductor memory device, and more particularly, to a multi-chip memory device including a plurality of memory chips and a method of controlling the same.

2. Description of the Related Art

As technologies of mobile devices have been developed, miniaturized and lightweight semiconductor products are required. For this, more devices are integrated in a single chip area to increase functions and capacities. Also, techniques for integrating a plurality of chips into one semiconductor chip package are developed.

Among the packaging techniques, a Dual Die Package (DDP) is one kind of a multi-chip package technique and is a technique for mounting two chips having a same structure in one package. Since the two chips have the same interface, it is advantageous if operations of the DDP are the same as those of a single chip.

SUMMARY

Exemplary embodiments provide a multi-chip memory device including a plurality of the same memory chips packaged, which is recognized and controlled as a single memory chip by an external memory controller and a method of controlling the same.

According to an aspect of an exemplary embodiment, there is provided a multi-chip memory device including a first memory chip; and a second memory chip sharing an input/output signal line with the first memory chip, wherein each of the first memory chip and the second memory chip determines whether to execute a command unaccompanied by an address, by referring to a history of commands.

The command unaccompanied by an address may be a status read command.

One of the first memory chip and the second memory chip may output a status of a currently executing operation through an output driver in response to the status read command.

One among the first memory chip and the second memory chip that does not output the status of the currently executing operation may maintain an output terminal of an output driver in a high impedance (Hi-Z) status.

Each of the first memory chip and the second memory chip may further include a chip selector that detects whether to select a chip, by referring to a chip address; a command tracker that sequentially stores input commands and status data of a selected chip; and an output enable controller that controls the output driver to output the status data by referring to a status read command and the status data.

The command unaccompanied by an address may include a suspend or resume command.

Each of the first memory chip and the second memory chip may store continuously-input commands and input sequence information of the commands.

When the suspend or resume command is input, each of the first memory chip and the second memory chip may determine a suspend or resume operation by referring to the input sequence information of the commands.

When the suspend command is input, the latest selected one among the first memory chip and the second memory chip suspends an operation being performed.

When the resume command is input, a suspended operation of a memory chip having the latest operation suspended by the suspend command may be resumed first.

Each of the first memory chip and the second memory chip may include a chip selector that detects whether to select a chip, referring to a chip address; and a command tracker that stores history information of commands corresponding to each of the first memory chip and the second memory chip and input sequence information of the commands, wherein the command tracker determines whether to execute the suspend command or the resume command, by referring to the history information and the input sequence information.

The command tracker may set an operation of one memory chip, which is most recently selected by a chip address, to be suspended first in response to the suspend command.

The command tracker may set an operation of one memory chip, which is most recently suspended by a chip address, to be resumed first in response to the resume command.

According to an aspect of another exemplary embodiment, there is provided a method of outputting a status signal of a multi-chip memory device including a plurality of memory chips that share an input/output signal line include: storing a command and an address, provided from the external; storing a driving status of a chip selected referring to the command and the address; receiving a status read command from the external; and outputting a driving status signal of the selected chip and setting an output terminal of an unselected memory chip in high impedance (Hi-Z).

The status read command may output a status signal unaccompanied by a chip address.

According to an aspect of another exemplary embodiment, there is provided a method of executing a command in a multi-chip memory device including a plurality of memory chips that share an input/output signal line include storing commands for each of multi-chips, and input sequence information of the commands; receiving a suspend or resume command; and when performing a suspend or resume operation by referring to the stored commands and input sequence information, first suspending or resuming an operation of one memory chip, which is most recently selected from the plurality of memory chips.

A chip address might not be provided when the suspend or resume command is input.

The first suspending or resuming of the operation may include first suspending an operation of one memory chip, which is most recently selected by a chip address, in response to the suspend command.

The first suspending or resuming of the operation may include first resuming an operation of one memory chip, which is most recently suspended by a chip address, in response to the resume command.

According to an aspect of another exemplary embodiment, there is provided a multi-chip memory device including a first memory chip; and a second memory chip sharing an input/output signal line with the first memory chip, wherein when an address input from an external device that is external to the multi-chip memory device is matched to a specific address in a memory cell array, each of the first memory chip and the second memory chip accesses a buffer memory without an access to the memory cell array.

Each of the first memory chip and a second memory chip may further include an overlay window enable mode selector determining whether to enter an overlay window enable mode according to whether the address from the external device is matched to the specific address.

An input address may be simultaneously stored in the first memory chip and the second memory chip during the overlay window enable mode.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain principles of the inventive concept. In the drawings.

DETAILED DESCRIPTION

Figure 1:
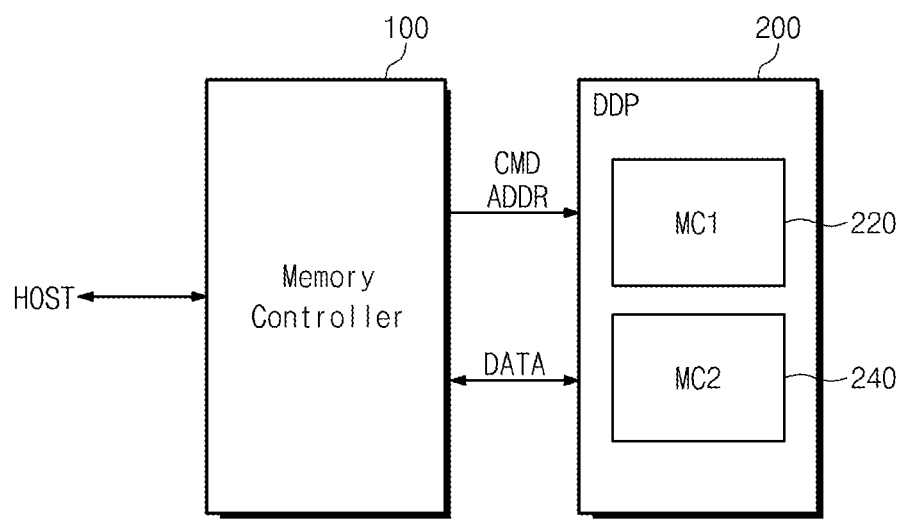
FIG. 1 is a block diagram illustrating a memory system according to an exemplary embodiment.

It should be construed that the foregoing general illustrations and the following detailed descriptions are exemplary. Reference numerals are indicated in detail in exemplary embodiments, and their examples are represented in reference drawings. In every possible case, like reference numerals are used for referring to the same or similar elements in the description and drawings. Like reference numerals refer to like elements throughout.

The inventive concept may be embodied or applied through other exemplary embodiments. Besides, the detailed description may be amended or modified according to viewpoints and applications, and these viewpoints and applications are within the scope, technical idea and other objects of the inventive concept. Exemplary embodiments will be described below in more detail with reference to the accompanying drawings.

FIG. 1 is a block diagram illustrating a memory system according to an exemplary embodiment. The memory system includes a memory controller 100 and a multi-chip memory device 200.

The memory controller 100 transmits a command and an address for program and read operations to the multi-chip memory device 200. The memory controller 100 may perform general control operations to access the multi-chip memory device 200 in response to a request from a host.

The multi-chip memory device 200 includes a first chip (MC1) 220 and a second chip (MC2) 240. The first chip 220 and the second chip 240 may include dies having a same structure. That is, the die of the first chip 220 may have the same structure as the die of the second chip 240. Each of the dies corresponding to the first chip 220 and the second chip 240 receives a same command and address from the memory controller 100. The multi-chip memory device 200 substantially includes a plurality of memory chips, e.g., the first chip 220 and the second chip 240, but the multi-chip memory device 200 is recognized and controlled as a single chip by an external device or controller. An address ADDR provided from the memory controller 110 may include at least one address bit for distinguishing the first chip 220 from the second chip 240. For example, if an address to access a 512 Mb memory chip is 19 bits, an address of a Dual Die Package (DDP) having packaged two 512 Mb memory chips may be 20 bits including at least one bit added. That is, an address of a 1 Gb memory chip including one die may be 20 bits. Accordingly, the memory controller 100 that is external to the DDP does not recognize that the multi-chip memory device 200 has two 512 M chips but recognizes and controls the multi-chip memory device 200 as a one 1 Gb chip.

In order to recognize and control the plurality of the same memory chips as a single chip, the multi-chip memory device 200 may respond to an external command or control in the same method as a single chip. In order for the multi-chip memory device 200 to respond in the same manner as a single chip, it is advantageous if the responses of the two chips to a command or a control without an address are defined clearly such that, for example, each of the first chip 220 and the second chip 240 in the multi-chip memory device 220 responds to a polling command or a suspend-resume command without competing with one another.

Figure 2:
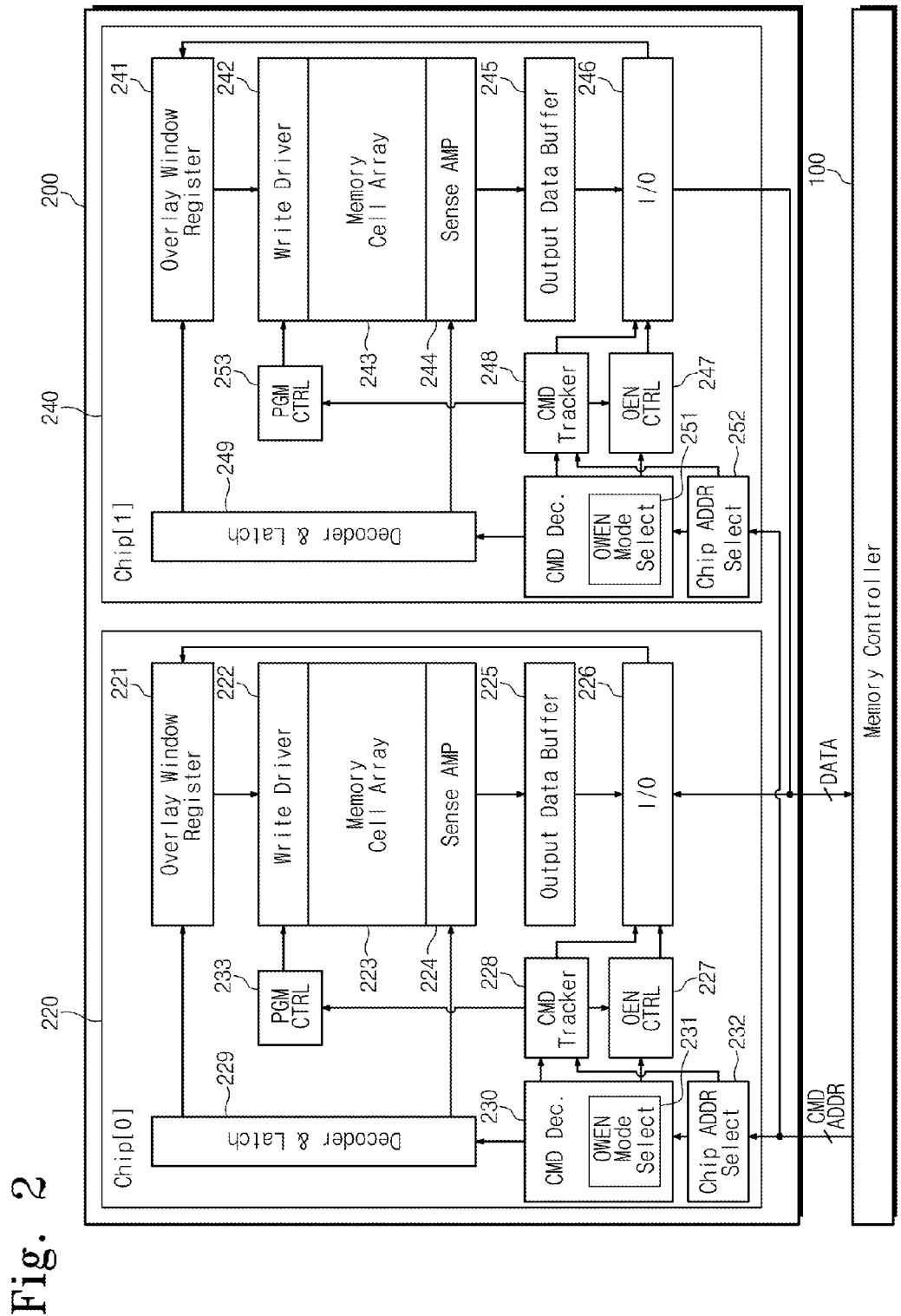
FIG. 2 is a block diagram of a multi-chip memory device according to an exemplary embodiment.

FIG. 2 is a block diagram of a multi-chip memory device according to an exemplary embodiment. The multi-chip memory device 200 includes a first chip 220 and a second chip 240 having the same structure. The first chip 220 includes a overlay window register 221, a write driver 222, a PGM CTRL 233, a memory cell array 223, a sense AMP (or S/A) 224, an output data buffer 225, an I/O 226, an OEN CTRL 227, a CMD tracker 228, a chip ADDR select 232, a CMD DEC 230, a OWEN mode selector 231, and a decoder & latch 229. Similarly, the second chip 240 includes a overlay window register 241, a write driver 242, a PGM CTRL 253, a memory cell array 243, a sense AMP (or S/A) 244, an output data buffer 245, an I/O 246, an OEN CTRL 247, a CMD tracker 248, a chip ADDR select 252, a CMD DEC 250, a OWEN mode selector 251, and a decoder & latch 249. Configurations and functions of the first chip 220 and the second chip 240 may be substantially identical. Accordingly, for convenience of description, only the configuration and function of the first chip 220 will be described.

The memory cell array 223 includes a plurality of bit lines (BLi, where i is 0 or a natural number), a plurality of word lines (WLj, where j is 0 or a natural number), and a plurality of memory cells connected to the bit lines BLi and the word lines WLj. The memory cells may be a flash memory and a resistive memory cell such as Phase-change Random Access Memory (PRAM) and Resistive Random Access Memory (RRAM) in which a program operation takes longer time than a read operation. The memory cell array may be divided in to a plurality of partitions and the partition may include a plurality of tiles.

The write driver 222 may write data in a memory cell in response to a control signal of the PGM CTRL 233. The write driver 222 may write data to be written, which are temporarily stored in a write buffer such as the overlay window register 221 through the I/O 226, in the memory cell array 223.

The sense AMP 224 performs a verify read or read operation of the data stored in the memory cell array 223. The verify read operation denotes a read operation for determining whether a program operation of data is successful or not. Once a typical read command is input, the sense AMP 224 senses the data stored in the selected memory cells and outputs the data as binary data.

The chip ADDR select 232 detects that a chip address bit is identical once a command and an address are input from a device that is external to the multi-chip device 200. The chip ADDR select 232 refers to a bit value for selecting a chip from an input address and activates an operation of a corresponding chip. In the same manner, the chip ADDR select 252 in the second chip 240 refers to a bit value for selecting a chip from an input address and determines whether to activate the second chip 240 or not. The chip ADDR select 232 and the chip ADDR select 252 determine which one of the first chip 220 and the second chip 240 operates. For example, if the first chip 220 and the second chip 240 are distinguished using a Most Significant Bit (MSB) in a DDP, the first chip 220 may be selected when an MSB value is '0' and the second chip 240 may be selected when an MSB value is '1'.

The CMD DEC 230 decodes a command input from the memory controller 100. In addition, the CMD DEC 230 includes the OWEN mode select 231. The OWEN mode select 231 determines, according to an input address, whether to access the overlay window register 221 or the memory cell array 223.

The decoder & latch 229 includes a column address decoder and a row address decoder. The column address decoder may select at least one bit line from a plurality of bit lines BLi and the row address decoder may select at least one word line from a plurality of word lines WLi.

The CMD tracker 228 stores each operation status of the first chip 220 and the second chip 240. For example, when a chip address having a logic value '0' and a read command are applied to the first chip 220, the CMD tracker 228 may store a status indicating that the first chip 220 performs a read operation. The CMD tracker 228 may store a command input to the second chip 240 in addition to the first chip 220. Accordingly, the CMD tracker 228 in the first chip 220 stores commands input to the second chip 240 and their order information in addition to the commands input to the first chip 220. Functions of the CMD tracker 228 are performed similar to those of the CMD tracker 248 in the second chip 240.

The OEN CTRL 227 controls the I/O in response to control signals provided from the CMD DEC 230 and the CMD tracker 228. Operations of the OEN CTRL 227 will be described in more detail with reference to FIG. 4. The I/O 226 may output data stored in the output data buffer 225 or may transmit data input for programming to the overlay window register 221. Additionally, the I/O 226 includes an output driver described later and thus may prevent data output of another chip when data are output from one chip. In relation to the multi-chip memory device 200, even though multi-chips are recognized or controlled as one memory chip from a device that is external to the multi-chip memory device 200, each of the multi-chips may respond without mutual interference.

FIGS. 3 through 6 are a flowchart, a block diagram, and a timing diagram, respectively, for illustrating a polling operation of a multi-chip memory device according to an exemplary embodiment. In a nonvolatile memory device such as a flash memory, PRAM, and RRAM, a program operation typically takes a longer time than a read operation. In the case of a memory device having a large bandwidth difference between a read operation and a program operation, a handshake-based interface is provided to increase channel efficiency. For this, a memory controller checks a Device Read Bit (DRB) used for confirming an operation completion after providing an operation execution command to a memory device. A status read command such as DRB check typically does not include an address. Accordingly, in the case of the multi-chip memory device 200, which chip among chips receiving the same command outputs a DRB signal becomes an issue. According to an exemplary embodiment, in relation to a status read operation, a means and a method of allowing multi-chips to respond without mutual interference is disclosed.

Figure 3:
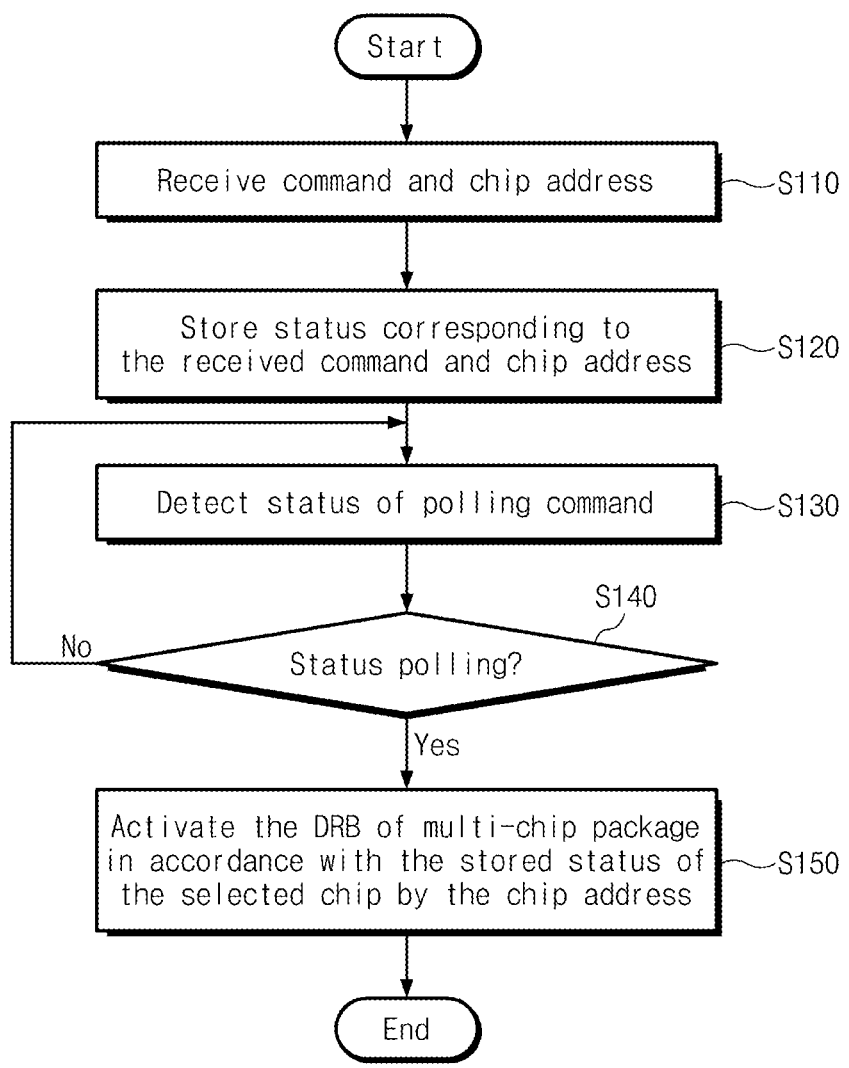
FIG. 3 is a flowchart illustrating a method of operating a multi-chip memory device 200 according to an exemplary embodiment.

FIG. 3 is a flowchart illustrating a method of operating a multi-chip memory device 200 according to an exemplary embodiment. Referring to FIGS. 2 and 3, an operation procedure of each of multi-chips during a read operation such as a polling command will be described.

The multi-chip memory device 200 receives a command and a chip address from the memory controller 100 in operation S110. The multi-chip memory device 200 stores a status of a chip corresponding to the received command and chip address in each of the CMD trackers 228 and 248 in operation S120. A status of a polling command is detected in operation S130. That is, it is checked that a polling command for confirming an operating status of the multi-chip memory device 200 returns periodically in operation S130.

Then, it is confirmed whether a polling operation is performed or not. If a polling command is input, a procedure moves to operation S150 for outputting a status with reference to the previously stored command and chip address. That is, the DRB of the multi-chip package is activated in accordance with the stored status of the selected chip by the chip address. On the contrary, if no polling command is input, the operation returns to operation S130 for detecting an input of a polling command continuously in operation S140.

In operation S150, a status of a currently activated chip is output as a DRB signal to an external device by the previously input command. That is, only a chip selected by a chip address transmits a result of whether an operation for the previously input command is performed or not to the external device. But, a chip not selected by a chip address may maintain an output node of an output driver in a high impedance (Hi-Z) status in operation S150.

According to a status command output of the above method, even if a multi-chip includes at least two chips, the multi-chip may respond to a status read command without interference.

Figure 4:
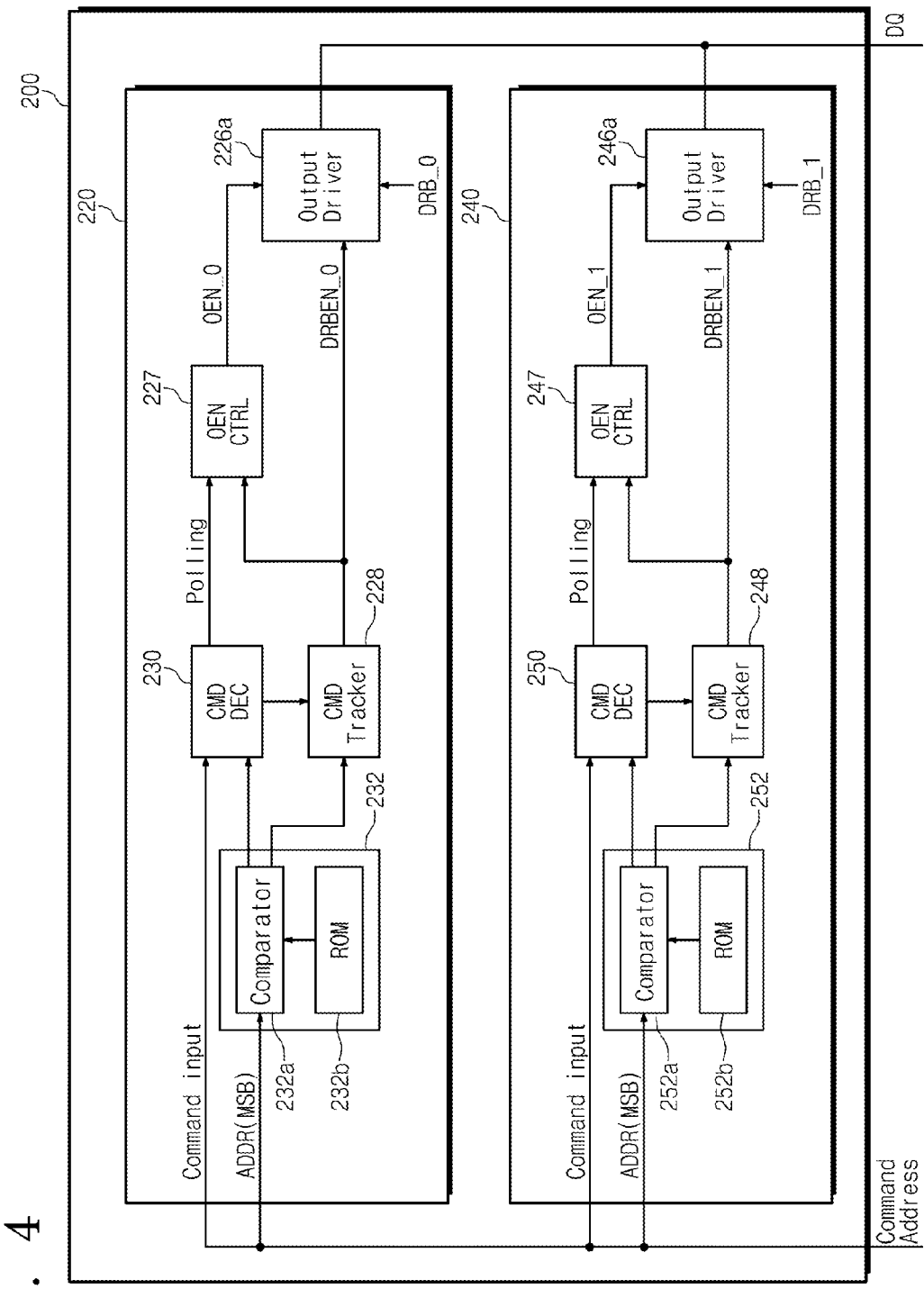
FIG. 4 is a block diagram illustrating a multi-chip memory device according to an exemplary embodiment.

FIG. 4 is a block diagram illustrating a multi-chip memory device 200 according to an exemplary embodiment. Especially, FIG. 4 illustrates components related to a polling operation and a command track among the components of FIG. 2 and a signal line according thereto. Each of functional blocks of the first chip 220 and each of corresponding functional blocks of the second chip 240 may perform the same function. Accordingly, only description for the functional blocks of the first chip 220 will be described.

The chip ADDR select 232 includes a comparator 232a and a Read Only Memory (ROM) 232b. The ROM 232b store an address bit representing an address of the first chip 220. For example, when the first chip 220 and the second chip 240 are distinguished from each other using an MSB, the first chip 220 may store '0' as an MSB value in the ROM 232b and the second chip 240 may store '1' as an MSB value in the ROM 252b.

The comparator 232a compares an address bit value stored in the ROM 232b with a chip address value from the memory controller 100 and then confirms whether the two values are identical. Then, a comparison result is delivered to the CMD DEC 230 and the CMD tracker 228. For example, if the chip address is '0', the first chip 220 may be activated and if the chip address is '1', the second chip 240 may be activated.

The CMD DEC 230 decodes a command input from the memory controller 100 and then transmits the decoded command to the CMD tracker 228 and the OEN CTRL 227. Additionally, when a polling command is received, the signal is transmitted to the OEN CTRL 227.

The CMD tracker 228 receives activated chip information from the chip ADDR select 232 and a command from the CMD DEC 230. Then, the CMD tracker 228 stores a status of the first chip 220. Then, the CMD tracker 228 transmits a DRB enable signal DRBEN_0 to the OEN CTRL 227 and the output driver 226a.

The OEN CTRL 227 receives a polling signal and a DRB enable signal DRBEN_0 from the CMD DEC 230 and transmits an output enable signal OEN_0 to the output driver 226a.

The output driver 226a receives the output enable signal OEN_0 and the DRB enable signal DRBEN_0 and then transmits a DRB_0 external to the multi-chip package. If the output enable signal OEN_0 is in an inactive status, the output driver 226a maintains an output node in a high impedance (Hi-Z) status. Then, the output driver 226a maintains an output node in a high impedance (Hi-Z) status even if the DRB enable signal DRBEN_0 is in an inactive status. An operation of the output driver 246a is controlled identical to that of the output driver 226a.

Figure 5:
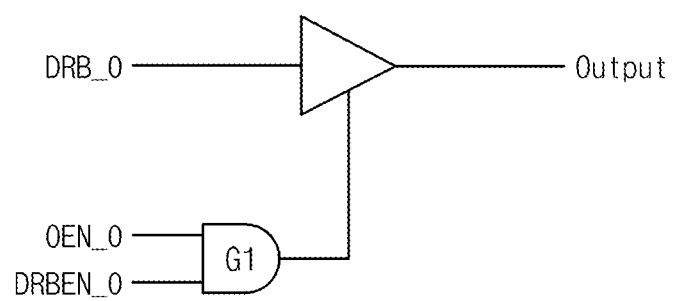
FIG. 5 is a circuit diagram illustrating an output driver of the multi-chip memory device of FIG. 4.

FIG. 5 is a circuit diagram illustrating a detailed example of the output driver 226a, which is a component of the multi-chip memory device 200 of FIG. 4. Referring to FIG. 5, the output driver 226a including a tri-state buffer determines whether to output a DRB signal DRB_0 according to the DRB enable signal DRBEN_0 and the output enable signal OEN_0. For this, the output driver 226a may include a gate G1 for an AND operation of the DRB enable signal DRBEN_0 and the output enable signal OEN_0. The tri-state buffer is controlled according to the AND operation of the DRB enable signal DRBEN_0 and the output enable signal OEN_0.

According to this configuration, the DRB signal DRB_0 maybe transmitted external to the multi-chip device 200 only when the first chip 220 executes an input command. On the other hand, when any one of the DRB enable signal DRBEN_0 and the output enable signal OEN_0 is in an inactive status, the output driver 226a may maintain an output terminal in a high impedance (Hi-Z) status.

Figure 6:
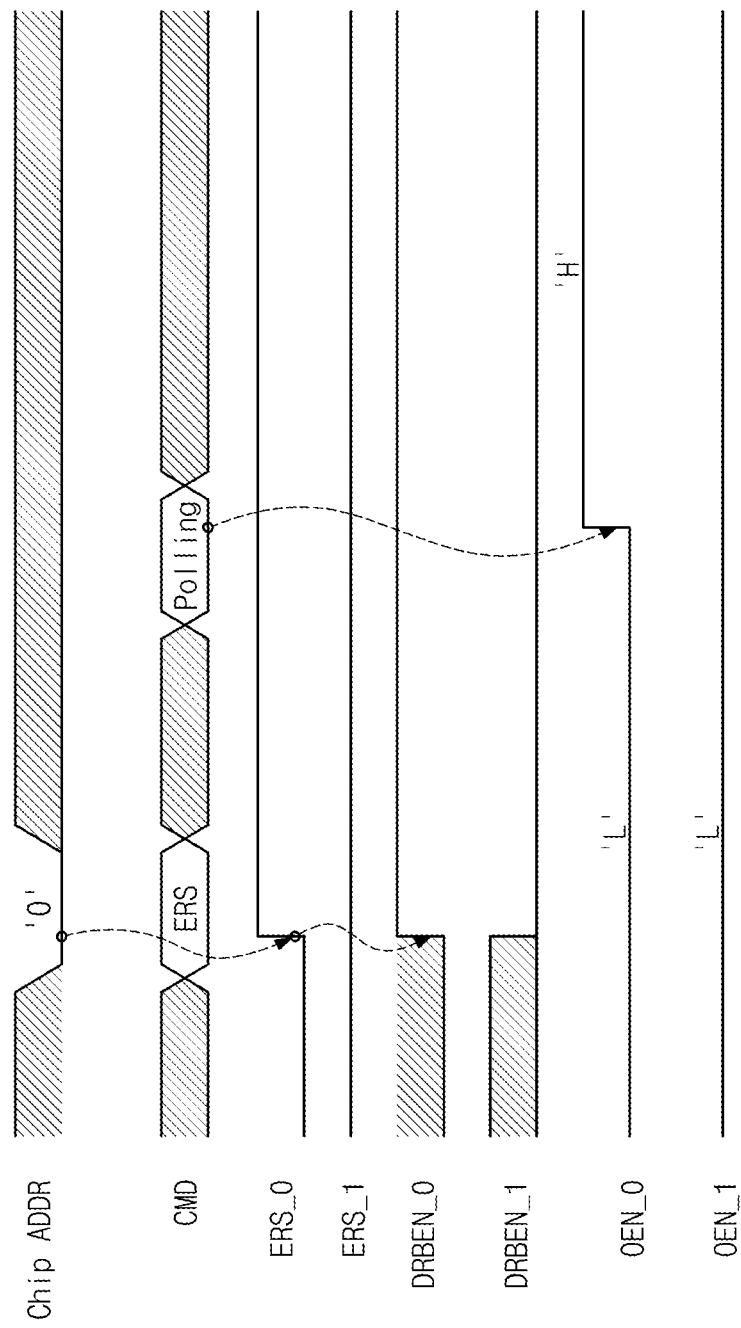
FIG. 6 is a timing diagram illustrating an operation of a multi-chip memory device according to an exemplary embodiment.

FIG. 6 is a timing diagram illustrating an operation of a multi-chip memory device according to an exemplary embodiment. Referring to FIGS. 4 and 6, once a chip address with a value '0' and an erase command ERS are transmitted from the memory controller 100, the first chip 220 is activated. Accordingly, a signal ERS_0 is raised to a logic 'high' level and a signal ERS_1 of the second chip 240 is maintained in a logic 'low' level. The first chip 220 executes an erase operation of data and stores the statuses in the CMD tracker 228. The CMD tracker 228 transmits the DRB enable signal DRBEN_0 having a logic 'high' level to the OEN CTRL 227 and the output driver 226a. At this point, the CMD tracker 248 of the second chip 240 transmits a DRB enable signal DRBEN_1 having a logic 'low' level to the OEN CTRL 247 and the output driver 246a.

Later, once a polling command is input to each of the first chip 220 and the second chip 240, the OEN CTRL 227 of the first chip 220 generates an output enable signal OEN_0 having a logic 'high' level. An output enable signal OEN_1 of the second chip 240 is maintained in a logic 'low' level. That is, a DRB signal DRB_1 generated in the second chip 240 becomes inactive and a DRB signal DRB_0 in the output driver 226a of the first chip 220 is transmitted external to the multi-chip memory device 200.

FIGS. 7 through 11 are views according to another exemplary embodiment. In a memory device having a bandwidth difference between read and program operations, a suspend-resume command sequence is used. In order to perform an emergency operation that occurs suddenly in a currently operating memory device, a suspend-resume command sequence is used. In the case of a memory that needs a long execution time for an erase operation ERS, a suspend SUS command is input to stop the erase operation ERS in progress and to execute another operation. However, when a suspend-resume operation is repeated continuously, a command stack operation is used to provide sequential execution of input commands.

Typically, suspend SUS and resume RSM commands are not accompanied by an address. In the case of a single chip, only with a suspend SUS or a resume RSM command, a command stack operation is possible but in the case of a multi-chip memory device including a plurality of chips, since it is unclear that which operation of which chip is suspended or resumed, it is advantageous to provide a clarifying method thereof. According to another exemplary embodiment, even if a suspend-resume command is repeatedly input in a multi-chip memory device, each multi-chip may perform a designated operation without confusion. Methods and means for this operation will be described in more detail with reference to FIGS. 7 through 11.

Figure 7:
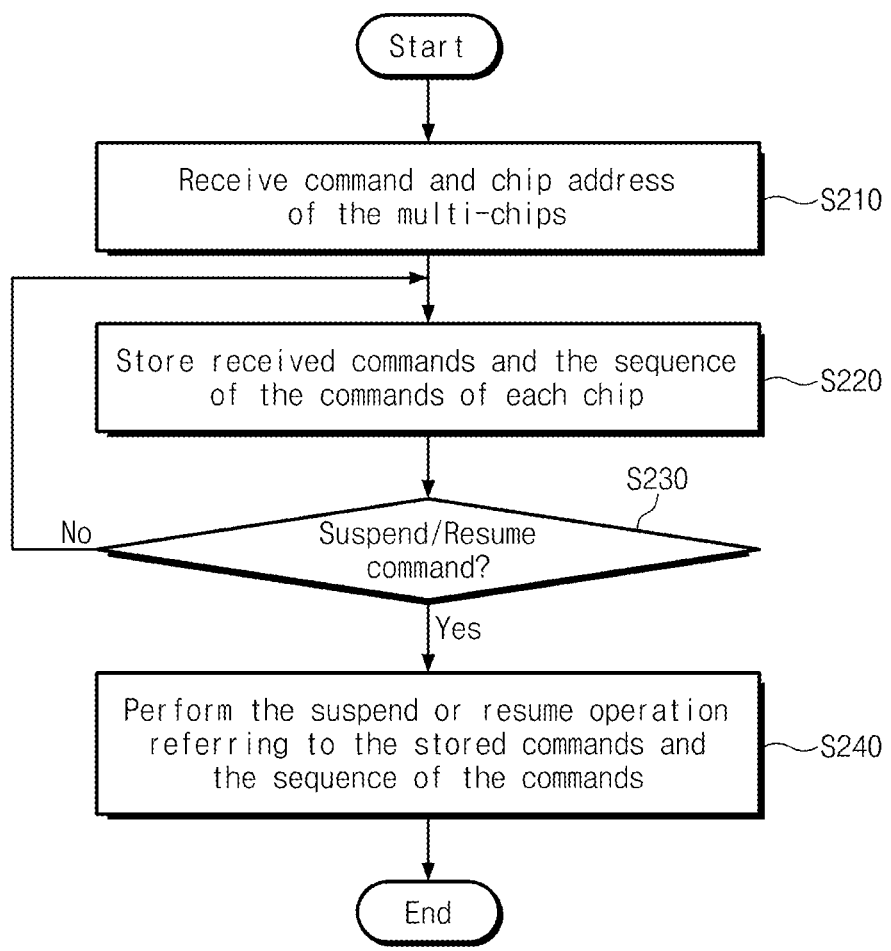
FIG. 7 is a flowchart illustrating a command stack operation of a multi-chip memory device according to another exemplary embodiment.

FIG. 7 is a flowchart illustrating a command stack operation of a multi-chip memory device according to another exemplary embodiment. Referring to FIG. 7, the multi-chip memory device 200 of FIG. 2 may operate as one chip responds during a suspend-resume operation, referring to a command and a chip address from the external device. This will be described in more detail as follows.

The multi-chip memory device 200 of FIG. 2 receives a chip address and a command from the external memory controller 100 of FIG. 2 in operation S210. The CMD tracker 228 stores commands that each of the memory chips 220 and 240 receives and each input sequence thereof in operation S220.

Then, it is detected whether a suspend or resume operation command is input in operation S230. If the suspend or resume operation command is not input, a procedure returns to operation S220 for storing continuously input commands and a mutual input sequence thereof. On the contrary, if the suspend or resume operation command is input, a suspend or resume operation, referring to the command input sequence stored in the CMD tracker 228 is performed in operation S240.

In operation S240, the CMD trackers 228 and 248 in the respective first and second memory chips 220 and 240 perform a suspend or resume operation, referring to a history about all previously input commands. For example, when the first chip 220 receives a suspend command during a program operation, the program operation of the first chip 220 is suspended. Additionally, when the first chip 220 receives an erase command and a suspend command and then the second chip 240 receives a program command and a suspend command, the CMD trackers 228 and 248 store an input history of the general commands. Then, once a resume command is input, the program operation of the second chip 240 is resumed. Again, once a resume command is input, the suspended erase operation of the first chip 220 is resumed.

That is, in relation to the DDP, when a command of a suspend-resume operation is input, chip address information is not input together. Accordingly, in order to accurately perform the suspend-resume command, a history of the commands stored in the CMD trackers 228 and 248 is referred to.

Figure 8:
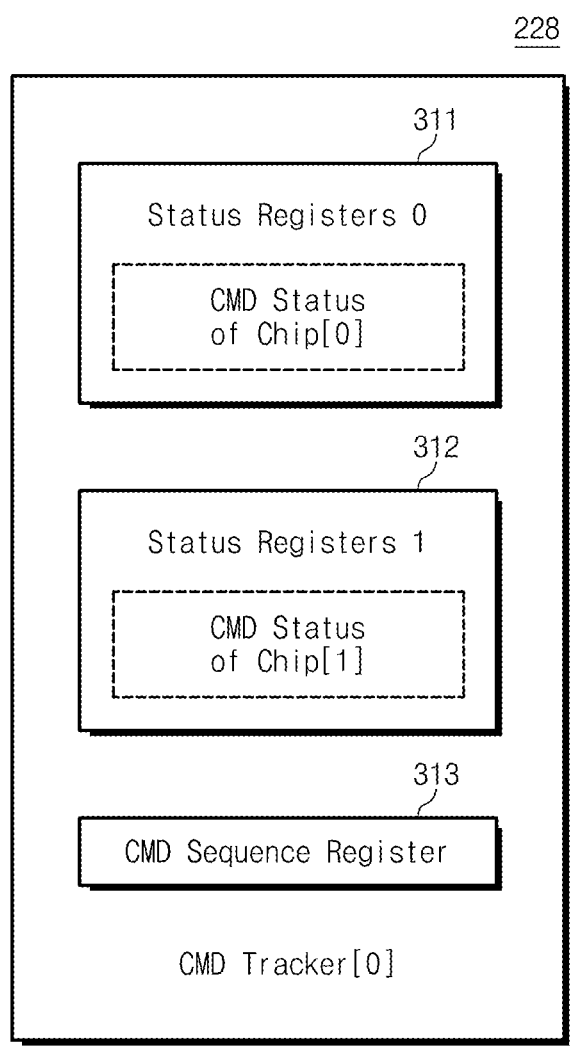
FIG. 8 is a block diagram illustrating a CMD tracker of the multi-chip memory device of FIG. 2.

FIG. 8 is a block diagram illustrating an example of the CMD tracker 228 of FIG. 2. The CMD tracker 228 includes a status register 311 of the first chip 220, a status register 312 of the second chip 240, and a CMD sequence register 313. The status register 311 of the first chip 220 stores an operational status of the first chip 220. For example, while the first chip 220 performs an erase operation, an erase ERS operation status is stored. The status register 312 of the second chip 240 stores an operating status of the second chip 240. For example, when a program operation is performed in the second chip 240, a program PGM operation status is stored. The CMD sequence register 313 sequentially stores commands input in each chip. For example, when an erase operation is suspended in the first chip 220 and then a program operation is suspended in the second chip 240 during execution and then a resume command is continuously input, the CMD sequence register 313 may store "ERS[0]-SUS-PGM[1]-SUS-RSM-RSM".

The CMD tracker 228 determines whether to execute a command without an address, referring to a history of the commands stored in the status register 311, the status resistor 312, and the CMD sequence register 313.

Figure 9:
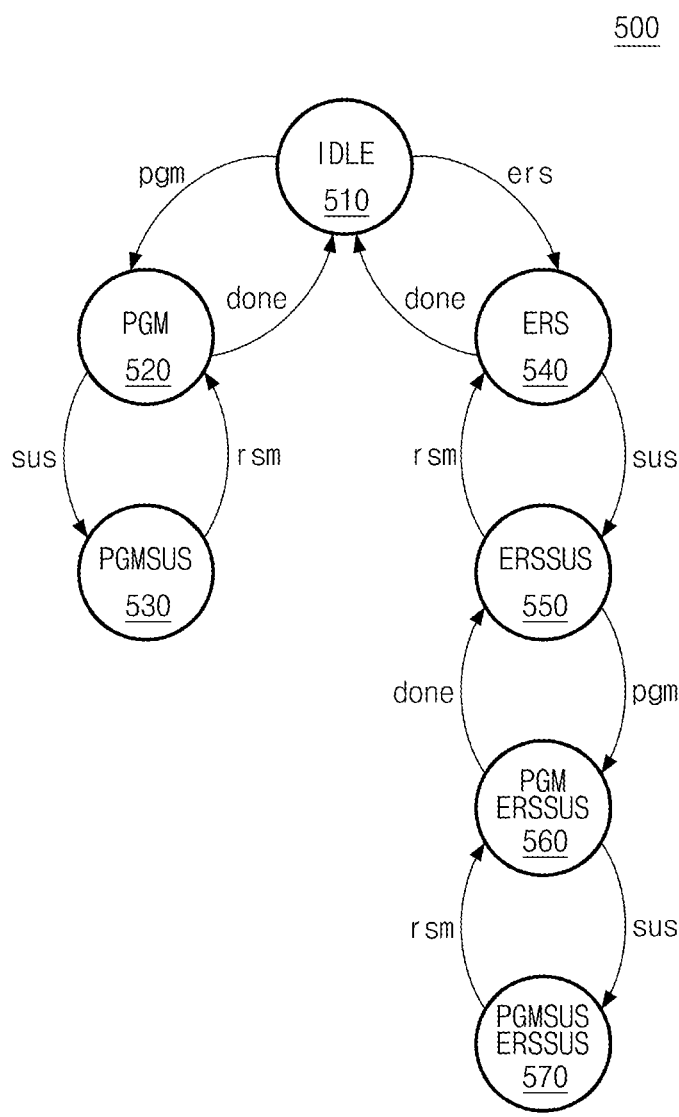
FIG. 9 is a state diagram showing program PGM and erase ERS operations in the case of a single chip.

FIG. 9 is a state diagram showing an example of program PGM and erase ERS operations in the case of a single chip. Since the memory controller 100 may set the multi-chip memory device 200 as a single chip and may transmit a command, the state diagram 500 illustrates states when the memory controller 100 is used.

The memory device in IDLE 510 receives a program signal PGM or an erase signal ERS from the memory controller 100 and performs it. For example, the memory device performs a program operation in PGM 520 on receiving a program signal pgm, and on receiving a suspend signal sus, a program operation is program suspended in PGMSUS 530. Then, on receiving a resume signal rsm, the state returns to a program operation in PGM 520. Once the program operation PGM is completed, the memory device transmits a signal done to the memory controller.

As another example, on receiving an erase signal ers, an erase operation is performed in ERS 540 and on receiving a suspend signal sus, the erase operation is erase suspended in ERSSUS 550. Then, on receiving a resume signal rsm again, the state returns to an erase operation state in PGM 540.

However, when a program signal pgm is received in ERSSUS 550, a program operation is performed in an erase suspended state in PGM ERSSUS 560. Once a suspend signal sus is received again in the above state, an erase operation and a program operation are suspended in PGMSUS ERSSUS 570. In this case, once a resume signal rsm is input, the latest suspended write operation is resumed first in PGM ERSSUS 560.

Figure 10:
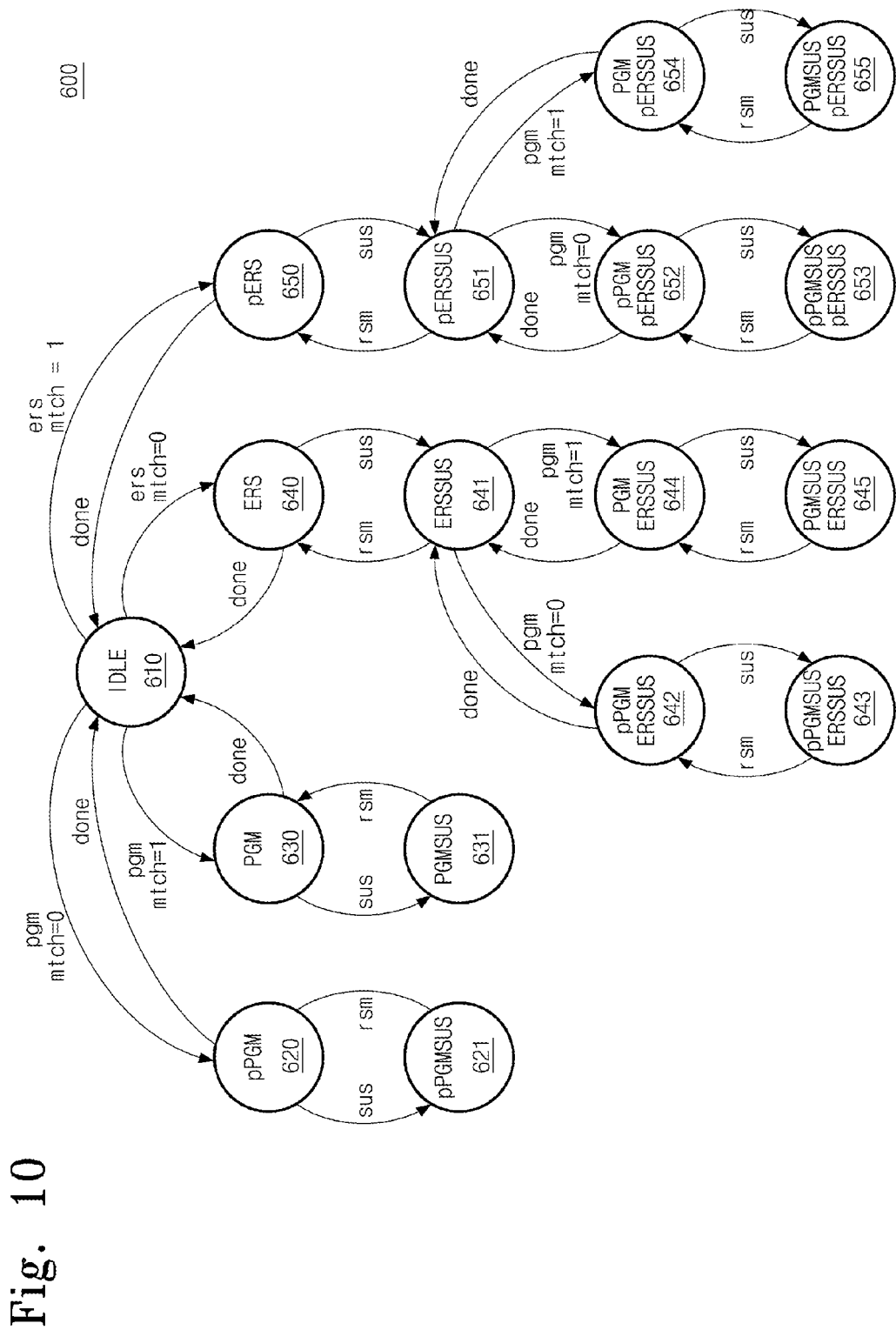
FIG. 10 is a state diagram showing program PGM and erase ERS operations in a multi-chip memory device according to an exemplary embodiment.

FIG. 10 is a state diagram showing an example of program PGM and erase ERS operations in a multi-chip memory device according to an exemplary embodiment. When a program or erase operation is performed in a DDP including two chips, only one of the two chips performs an operation. However, since operations of the two chips are recognized as those of a single chip from the viewpoint of an external device, it is assumed that an idle chip performs a pseudo operation.

For example, the multi-chip memory device 200 in IDLE 610 performs a program operation on the second chip 240 in PGM 630 once a program signal pgm and a chip address '1' signal (pgm mtch=1) are received. Since the memory controller 100 sets the multi-chip memory device 200 as a single chip, even though the first chip 220 does not operate, it may be in pPGM 620. The second chip suspends a program operation in PGMSUS 631 when a suspend signal sus is input in PGM 630 and then returns to PGM 630 on receiving a resume signal rsm again. Once the program operation PGM is completed, the memory device 200 transmits an operation completion signal done to the memory controller 100.

As another example, the memory device 200 performs an erase operation in ERS 640 in the first chip 220 once an erase signal ers and a chip address '0' signal (mtch=0) are received. The second chip 240 is not in an operational status but it is assumed that the second chip 240 performs a pseudo erase operation in pERS 650. Once a suspend signal sus is input to the memory device again, the erase operation of the first chip 220 is suspended in ERSSUS 641. Then, when a resume signal rsm is input again, the state returns to ERS 640. However, when a program signal pgm and a chip address '1' signal (match=1) are input in ERSSUS 641, the second chip 240 performs a program operation in PGM ERSSUS 644. When a suspend signal sus is input in the above state, the erase operation of the first chip 220 and the program operation of the second chip 240 are suspended in PGMSUS ERSSUS 645. In this case, once a resume signal rsm is input, the latest suspended program operation of the second chip 240 is resumed first in PGM ERSSUS 644.

Figure 11:
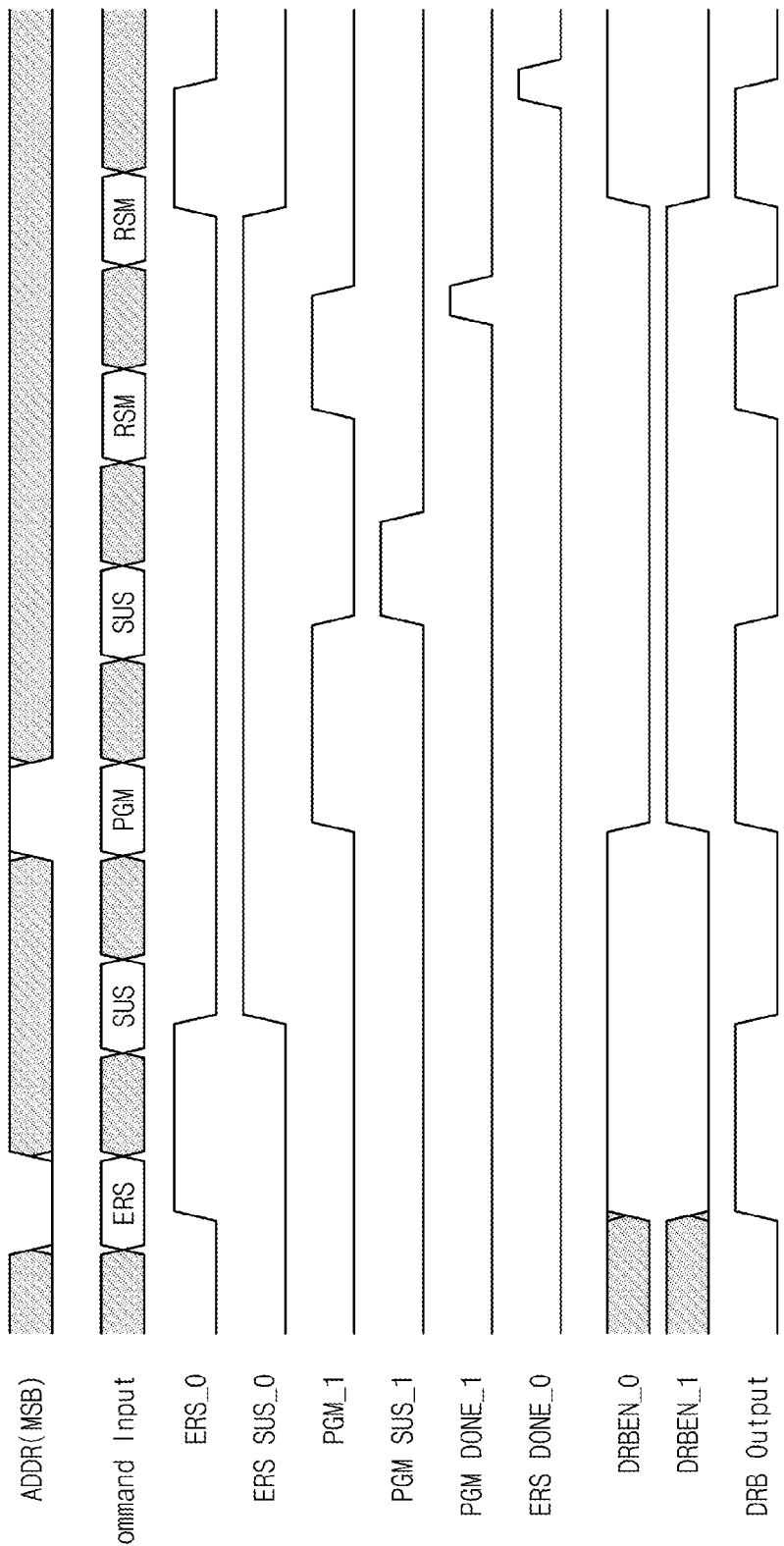
FIG. 11 is a timing diagram of a multi-chip memory device according to another exemplary embodiment.

FIG. 11 is a timing diagram of a multi-chip memory device according to another exemplary embodiment. Referring to FIGS. 4, 7, 8, 10, and 11, once a chip address '0' value and an erase command ERS are transmitted from the memory controller 100, the first chip 220 performs an erase operation. Accordingly, a signal ERS_0 is raised to a logic 'high' level and the DRB enable signal DRBEN_0 is raised to a logic 'high' level in response to a polling command.

Then, once a suspend command SUS is transmitted, an erase operation that the first chip 220 performs needs to be suspended. Accordingly, a signal ERS_0 representing whether an erase operation of the first chip 220 is performed or not is lowered to a logic 'low' level and a signal ERS SUS_0 is raised to a logic 'high' level.

Then, when a chip address '1' value and a program command PGM are input, a signal PGM_1 representing a status of a program operation in the second chip 240 is raised to a logic 'high' level. As a DRB enable signal DRBEN_0 of the first chip 220 is lowered to a logic 'low' level in response to a polling command, the ERB enable signal DRBEN_1 of the second chip 240 is raised to a logic 'high' level.

Then, once a suspend signal SUS is input, a program operation that the second chip 240 performs currently needs to be suspended. Accordingly, a signal PGM_1 representing a status of the program operation in the second chip 240 is lowered to a logic 'low' level.

Then, if a resume command is continuously input, each of the chips 220 and 240 performs a resume operation, referring to commands of the chips 220 and 240 and command input sequence stored in the CMD trackers 228 and 248. That is, the latest suspended operation is resumed first. Therefore, the program operation of the second chip 240 is resumed in response to a first resume command. Then, the erase operation of the first chip 220 is resumed in response to an input resume command.

FIGS. 12 through 15 are a block diagram, a flowchart, and a block diagram, respectively, for an overlay operation mode in a multi-chip memory device according to another exemplary embodiment. In a nonvolatile memory device such as a flash memory, PRAM, and RRAM, a program operation typically takes a longer time than a read operation. Accordingly, the read operation may directly access the memory cell array 223 without an intermediate stage but the program operation may store data first in a buffer such as Static Random Access Memory (SRAM) having a fast program speed and then stores the data in the memory cell array 223. The buffer may be called the overlay window register 221.

Figure 12:
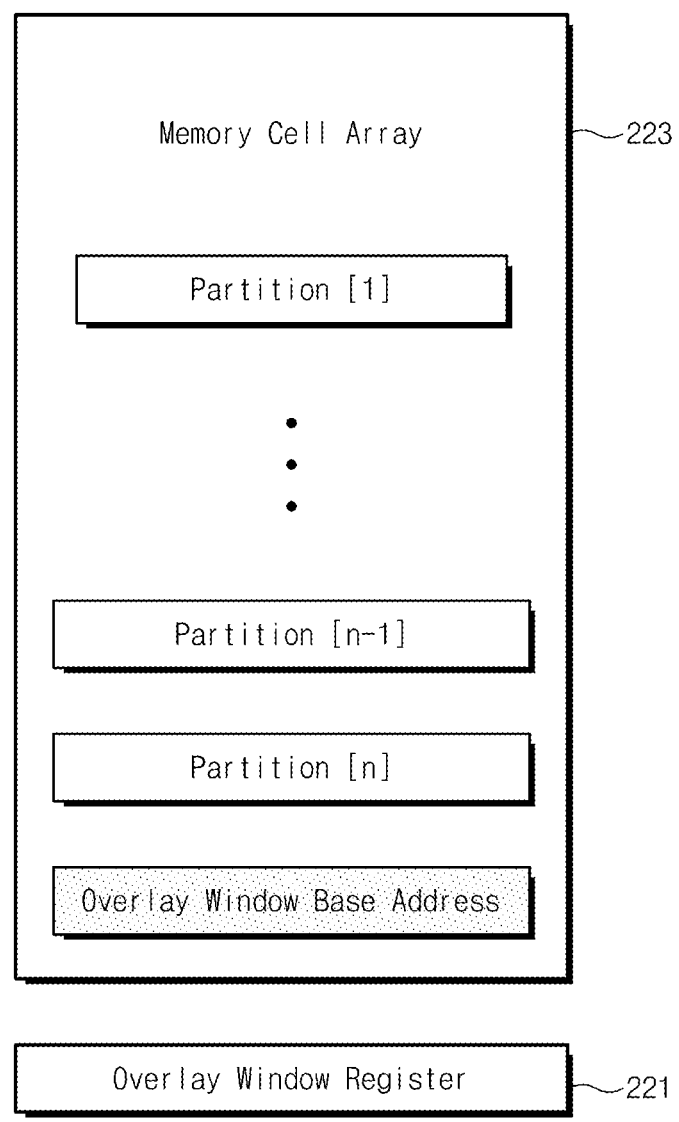
FIG. 12 is a block diagram illustrating a memory cell array and an overlay window register in the multi-chip memory device of FIG. 2.

FIG. 12 is a block diagram illustrating the memory cell array and the overlay window register in the multi-chip memory device of FIG. 2. Since the first chip 220 and the second chip 240 have the same functional blocks, only the first chip 220 will be described here. The memory cell array 223 is divided into a plurality of partitions and each of the partitions may include a plurality of tiles.

An address of the overlay window resistor 221 is not separately allocated and uses an address of a partial region of the memory cell array 223. Accordingly, an Overlay Window Base Address (OWBA), that is, a specific address of the memory cell array 221, does not indicate the memory cell array 223 and indicates the overlay window register 221. Furthermore, when an Overlay Window ENable (OWEN) mode is input, a command corresponding to the OWBA is used to control an internal operation such as an operation for writing data stored in the overlay window register 221 in the memory cell array 223.

Figure 13:
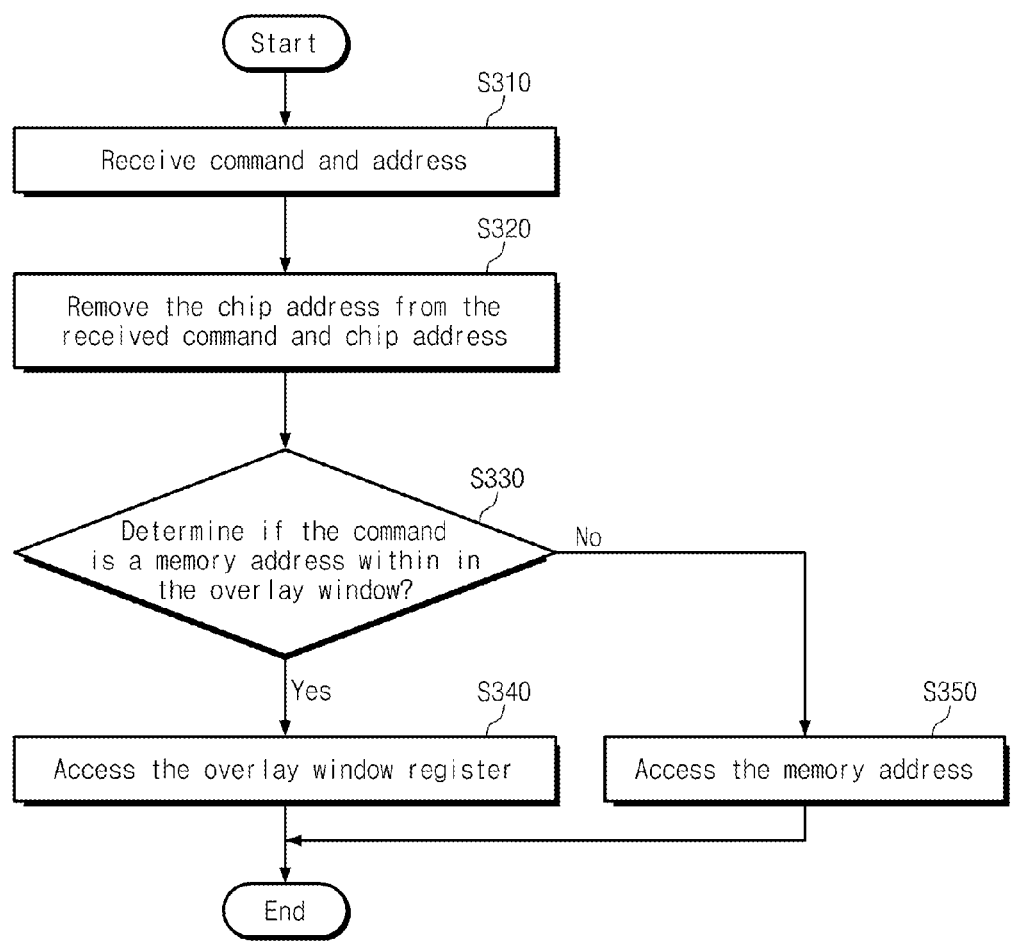
FIG. 13 is a flowchart illustrating an operation of a multi-chip memory device according to another exemplary embodiment.

FIG. 13 is a flowchart illustrating an operation of a multi-chip memory device according to another exemplary embodiment. Referring to FIGS. 2 and 13, the multi-chip memory device 200 receives a command and an address from the memory controller 100 in operation S310. After one chip is selected by the chip ADDR selects 232 and 252, the input command and address are transmitted to the CMD DECs 230 and 250 in operation S310. The OWEN mode selectors 231 and 251 in the CMD DECs 230 and 250 remove a chip address from the received addresses in operation S320 and then determine whether to enter a mode or not after comparing the received addresses without the chip address to the OWBA in operation S330. That is, in operation S330, it is determined if the command is a memory address within the overlay window. If the remaining address bit corresponds to the OWBA, the overlay window registers 221 and 241 are accessed in operation S340. However, if the remaining addresses bits do not correspond to the OWBA, the memory cell arrays 223 and 243 are accessed in operation S350.

Figure 14:
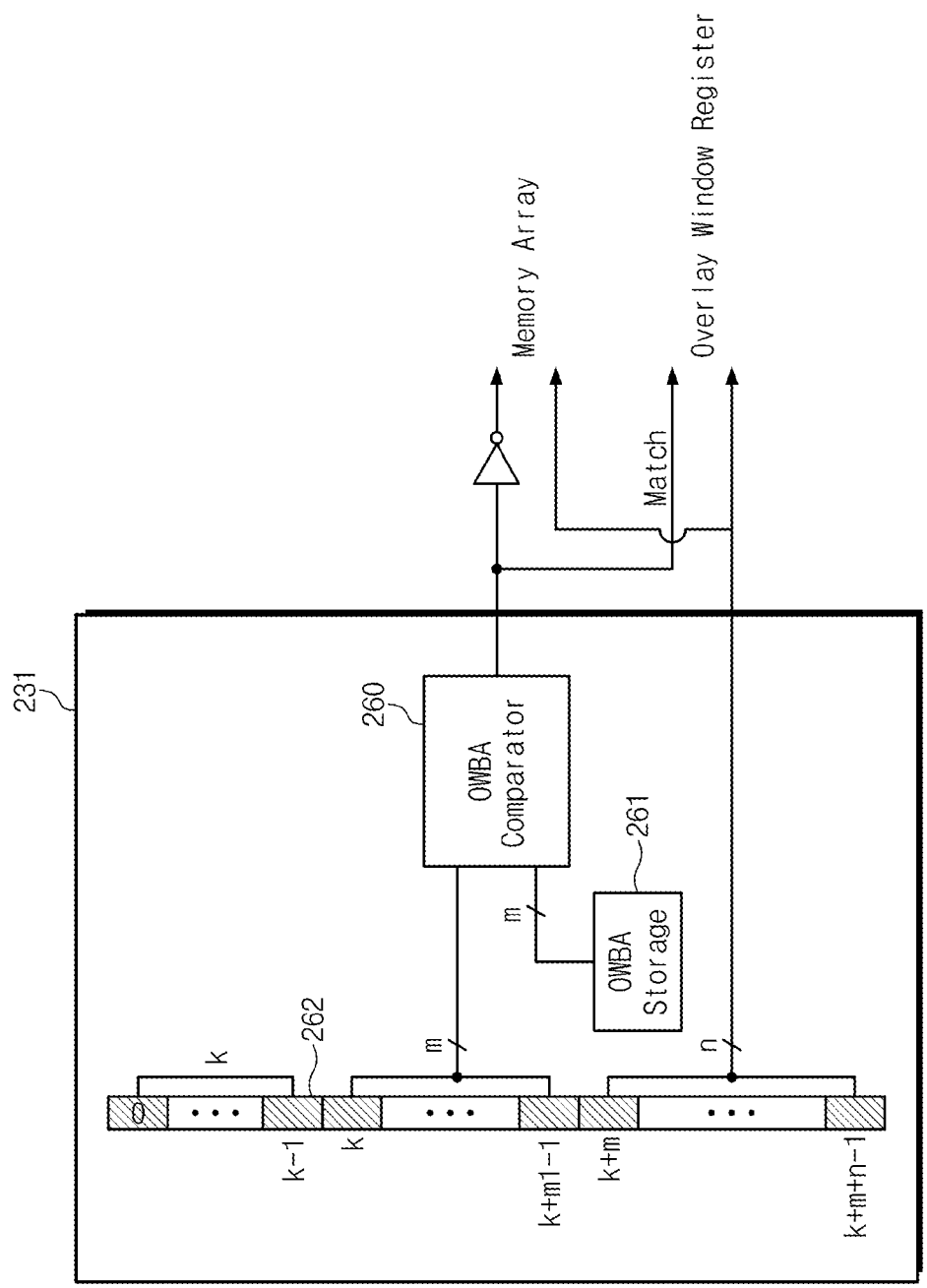
FIG. 14 is a block diagram illustrating a configuration of an OWEN mode selector of the multi-chip memory device of FIG. 2.

FIG. 14 is a block diagram illustrating a configuration of the OWEN mode selector 231 of FIG. 2. The OWEN mode selector 231 includes an OWBA storage 261 and an OWBA comparator 260.

Referring to FIGS. 2, 12, 13, and 14, when an address input to the OWEN mode selector 231 includes k+m+n bits, the k bits select a chip and the m bits determine whether an OWEN mode is to be entered. The n bits indicate a sub address. For example, when a capacity of an overlay window register is 8 Kb in a DDP including two 512 M memory chips packaged together, the number of k bits for selecting a chip may be 1 and the number of m bits for determining the entering of the OWEN mode may be 6 and the number of n bits representing a sub address other than those may be 13.

In the case of k bits for selecting a chip, the k bits may be set as 1 bit in a DDP or as 2 bits in a Quadrupled Die Package (QDP) or as 3 bits in Octuple Die Package (QDP), etc. according to the number of dies mounted in a memory package.

When examining an operation of the OWEN mode selector 231, once an address 262 of k+m+n bits is received from the memory controller 100, the OWBA comparator 260 compares the m bits with the OWBA stored in the OWBA storage 261. If the input address 262 corresponds to the OWBA, the OWEN mode is entered and then an overlay window register is accessed, and if the input address 262 does not correspond to the OWBA, a memory cell array is accessed. The n bits of a sub address represent an address after the overlay window register or the memory cell array is accessed.

Figure 15:
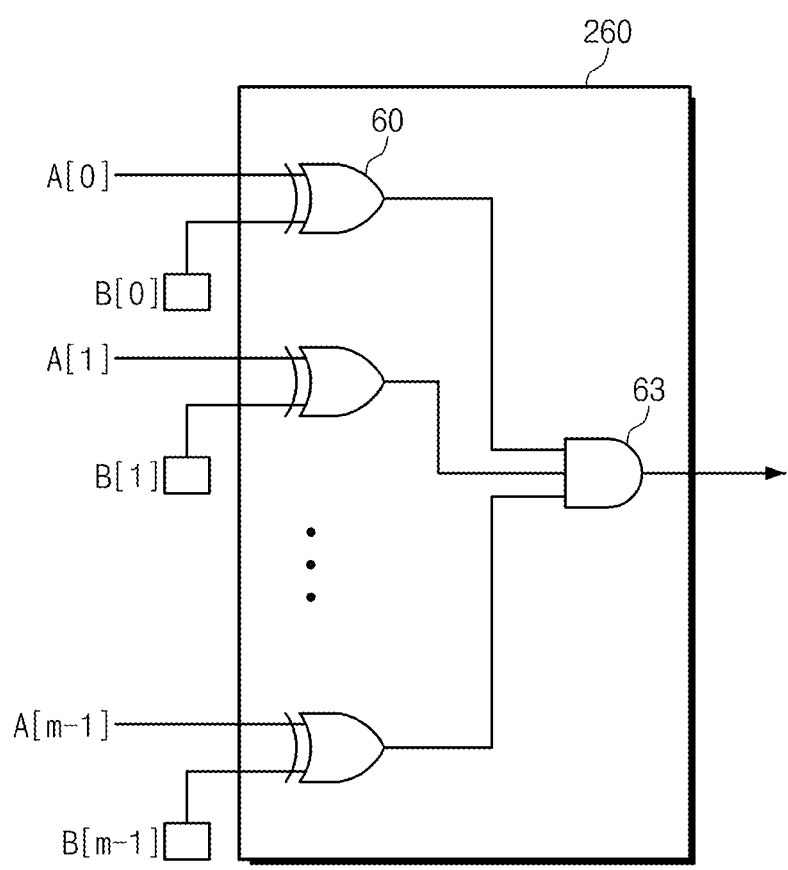
FIG. 15 is a logic diagram illustrating an OWBA comparator of the OWEN mode selector of FIG. 14.

FIG. 15 is a logic diagram illustrating the OWBA comparator 260 of FIG. 14.

Among addresses input to the OWEN mode select 231, the total m bits (A[0] to A[m-1]) (i.e., the bits from $k^{th}$ to k+m-1$^{th}$) and the OWBA (B[0] to B[m-1]) are input to an XOR gate 60 to determine whether they are identical or not and then the output values of the XOR gates 60 are input to an AND gate 63 so that whether the OWEN mode is entered may be determined only when all the input values are identical.

The configuration of the OWBA comparator 260 shown in FIG. 15 is just one example. Therefore, it will be apparent to those skilled in the art that the number of the above inverters and a configuration of logic devices may be modified to achieve the same object and also may partially vary due to timing characteristics of a semiconductor memory device.

Figure 16:
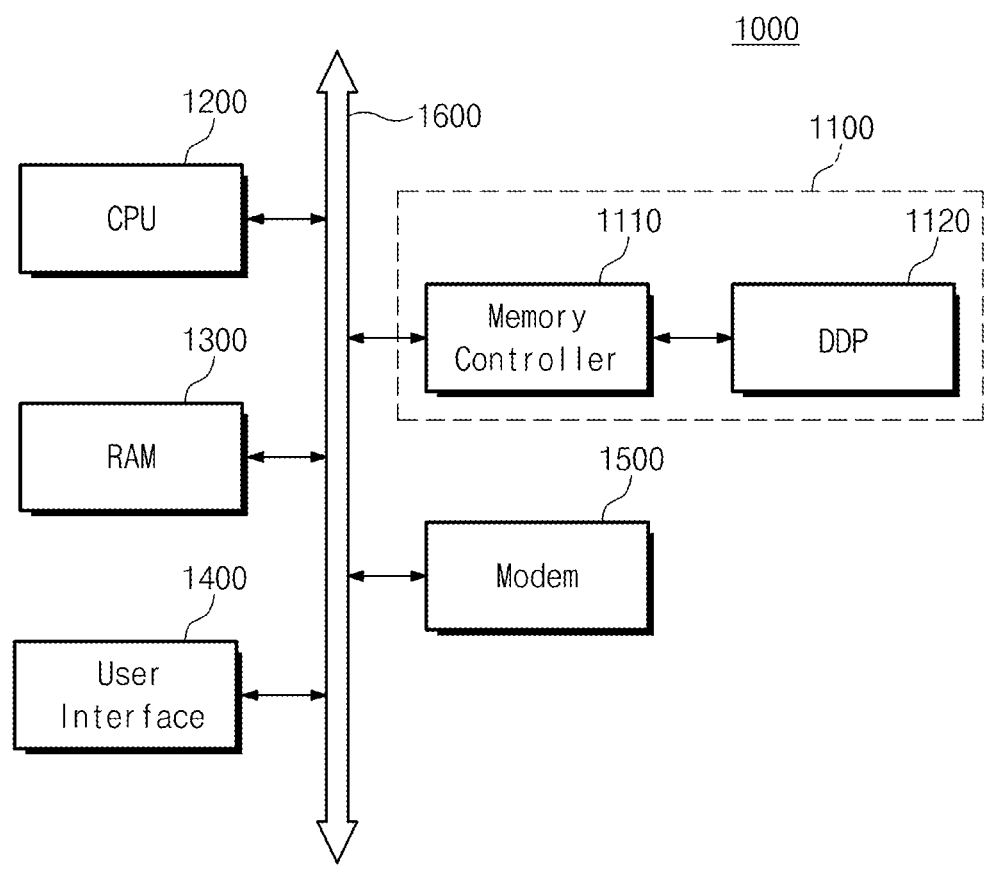
FIG. 16 is a block diagram illustrating an information processing system including a semiconductor memory according to an exemplary embodiment.

FIG. 16 is a block diagram illustrating an information processing system including a semiconductor memory according to an exemplary embodiment. Referring to FIG. 16, a DDP 1120 according to an exemplary embodiment is mounted in the information processing system such as a mobile device or a desktop computer. The information processing system 1000 may include a modem 1500, a Central Processing Unit (CPU) 1200, a RAM 1300, and a user interface 1400, which are electrically connected to the DDP 1120 through a system bus 1600. The DDP 1120 may have a substantially same configuration as the above-mentioned memory system. The DDP 1120 stores data processed by the CPU 1200 or data input from an external device. Although not shown in the drawings, it will be apparent to those skilled in the art that the information processing system 1300 may further include an application chipset, a Cameral Image Processor (CIS), and an input/output device, or the like.

A memory device or a memory controller according to exemplary embodiments may be mounted through various kinds of packages. For example, the a memory device and/or a memory controller according to exemplary embodiments may be mounted through packages such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

A multi-chip memory device according to the inventive concept increases data storage capacity with a plurality of the same memory chips packaged together and also provides a method of controlling the multi-chip memory device to perform the same operation as a single chip.

The above-disclosed subject matter is to be considered illustrative and not restrictive, and the appended claims are intended to cover all such modifications, enhancements, and other exemplary embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A multi-chip memory device comprising:
   a first memory chip which stores a history of a plurality of input commands; and
   a second memory chip which shares a signal line with the first memory chip,
   wherein the first memory chip determines whether to execute a command unaccompanied by an address and received via the signal line, by referring to the stored history of the plurality of input commands.

2. The multi-chip memory device of claim 1, wherein the command unaccompanied by an address is a status read command.

3. The multi-chip memory device of claim 2, wherein one of the first memory chip and the second memory chip outputs a status of a currently executing operation through an output driver in response to the status read command.

4. The multi-chip memory device of claim 3, wherein a chip among the first memory chip and the second memory chip that does not output the status of the currently executing operation maintains an output terminal of an output driver in a high impedance (Hi-Z) status.

5. The multi-chip memory device of claim 2, wherein each of the first memory chip and the second memory chip further comprises:
   a chip selector that detects whether to select a chip by referring to a chip address;
   a command tracker that sequentially stores input commands and information indicating status data of a selected chip; and
   an output enable controller that controls an output driver to output the status data referring to the status read command and the status data.

6. The multi-chip memory device of claim 1, wherein the command unaccompanied by an address comprises a suspend or resume command.

7. The multi-chip memory device of claim 6, wherein each of the first memory chip and the second memory chip stores continuously-input commands and input sequence information of the commands.

8. The multi-chip memory device of claim 7, wherein when the suspend or resume command is input, each of the first memory chip and the second memory chip determines a suspend or resume operation by referring to the input sequence information of the commands.

9. The multi-chip memory device of claim 8, wherein when the suspend command is input, the latest selected one among the first memory chip and the second memory chip suspends an operation being performed.

10. The multi-chip memory device of claim 8, wherein when the resume command is input, a suspended operation of a memory chip having the latest operation suspended by the suspend command is resumed first.

11. The multi-chip memory device of claim 6, wherein each of the first memory chip and the second memory chip comprises:
    a chip selector that detects whether to select a chip by referring to a chip address; and
    a command tracker that stores history information of commands corresponding to each of the first memory chip and the second memory chip and input sequence information of the commands,
    wherein the command tracker determines whether to execute the suspend command or the resume command by referring to the history information and the input sequence information.

12. The multi-chip memory device of claim 11, wherein the command tracker sets an operation of one memory chip, which is most recently selected by a chip address, to be suspended first in response to the suspend command.

13. The multi-chip memory device of claim 11, wherein the command tracker sets an operation of one memory chip, which is most recently suspended by a chip address, to be resumed first in response to the resume command.

14. A method of outputting a status signal of a multi-chip memory device including a plurality of memory chips that share a signal line, the method comprising:
    storing a command and an address;
    selecting a memory chip of the plurality of memory chips;
    storing a driving status of the selected memory chip corresponding to the command and the address in each of the plurality of memory chips;
    receiving a status read command; and
    outputting a driving status signal of the selected memory chip and setting an output terminal of an unselected memory chip in high impedance (Hi-Z).

15. The method of claim 14, wherein the status read command outputs a status signal unaccompanied by a chip address.

16. A method of accessing a multi-chip memory device that includes a plurality of memory chips, as a single memory chip device, the method comprising:
    receiving, from an external device that is external to the multi-chip memory device, a first command that includes one or more bits used to address one of the memory chips of the plurality of memory chips within the multi-chip memory device;
    selecting a memory chip of the plurality of memory chips using the one or more bits;
    executing the first command by the selected memory chip;
    receiving, from the external device, a second command that does not include any address bits; and
    determining whether to execute the second command according to a history of a plurality of input commands,
    wherein the history of the plurality of input commands is stored in the selected memory chip.

* * * * *